(12) United States Patent
Yokote et al.

(10) Patent No.: US 7,012,804 B2
(45) Date of Patent: Mar. 14, 2006

(54) ELECTRONIC APPARATUS HAVING REMOVABLE CIRCUIT BOARD TO CONNECT EXPANSION CARD

(75) Inventors: Satoshi Yokote, Ome (JP); Atsuhiro Yanagida, Hamura (JP); Takahiro Fujii, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 10/786,476

(22) Filed: Feb. 26, 2004

(65) Prior Publication Data

US 2004/0179345 A1 Sep. 16, 2004

(30) Foreign Application Priority Data

Feb. 28, 2003 (JP) .............................. 2003-053819

(51) Int. Cl.
*G06F 1/16* (2006.01)
(52) U.S. Cl. .................. 361/685; 361/709; 174/15.2; 349/65
(58) Field of Classification Search ............... 361/704, 361/709, 752, 753, 679–687, 724–727; 349/58–59, 349/65; 174/16.3, 15.2
See application file for complete search history.

(56) References Cited

U.S. PATENT DOCUMENTS

| | | | | |
|---|---|---|---|---|
| 6,157,538 A | * | 12/2000 | Ali et al. | 361/704 |
| 6,226,179 B1 | * | 5/2001 | Lee | 361/687 |
| 6,330,150 B1 | * | 12/2001 | Kim | 361/683 |

FOREIGN PATENT DOCUMENTS

JP 2002-280778 9/2002

* cited by examiner

*Primary Examiner*—Hung V. Duong
(74) *Attorney, Agent, or Firm*—Pillsbury Winthrop Shaw Pittman, LLP

(57) ABSTRACT

An electronic apparatus comprises a housing having an outer plate, and a circuit board housed removably in the housing. A fixing part is provided on the outer plate of the housing. The fixing part has a holder piece located inside of the housing farther than the outer plate. A bracket is fixed to the circuit board. The bracket has a fitting piece. The fitting piece is held between the outer plate and the holder piece, when the circuit board is housed in the housing.

15 Claims, 8 Drawing Sheets

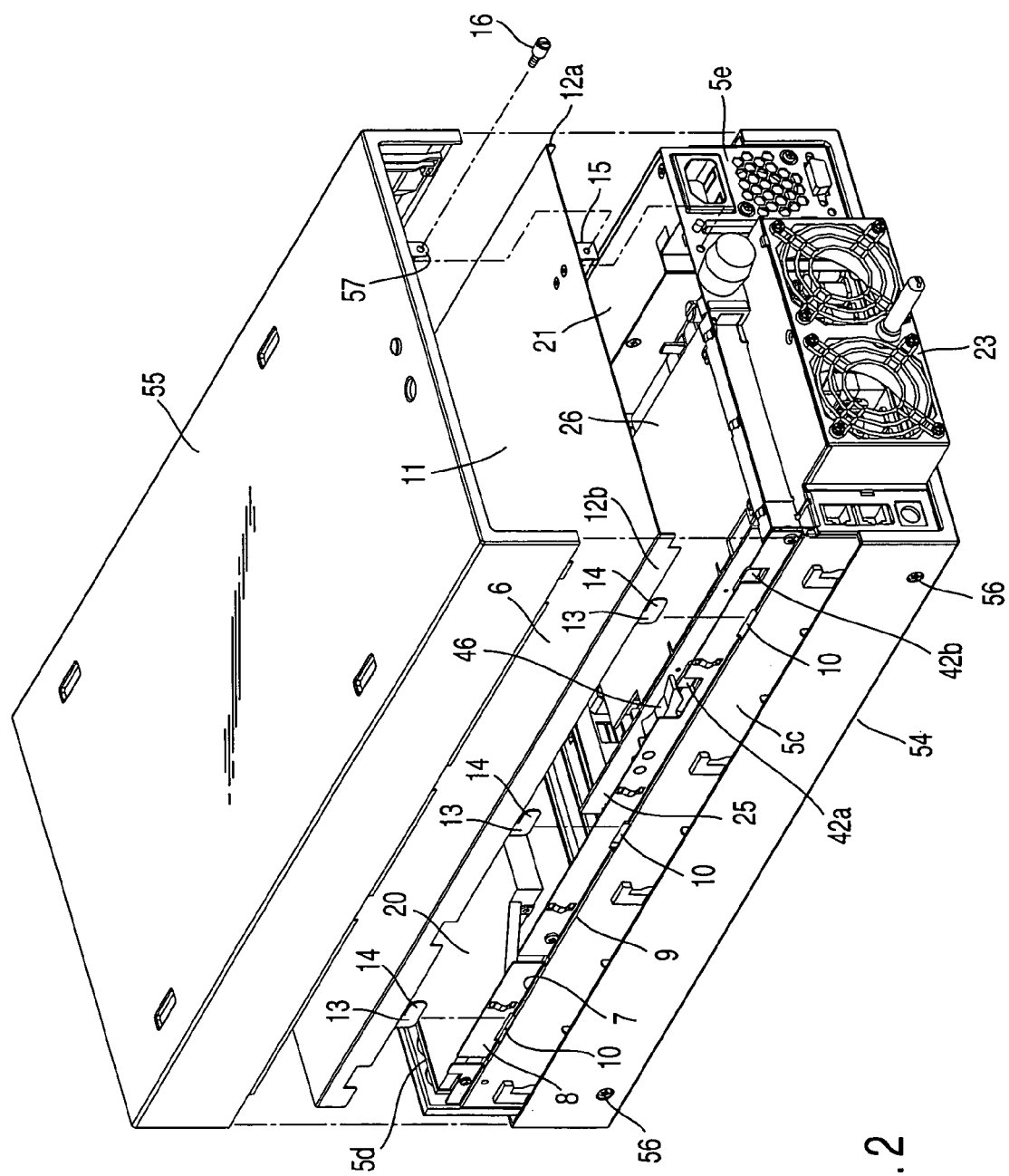
F I G. 2

ELECTRONIC APPARATUS HAVING REMOVABLE CIRCUIT BOARD TO CONNECT EXPANSION CARD

CROSS-REFERENCE TO RELATED APPLICATIONS

This application is based upon and claims the benefit of priority from prior Japanese Patent Application No. 2003-53819, filed Feb. 28, 2003, the entire contents of which are incorporated herein by reference.

BACKGROUND OF THE INVENTION

1. Field of the Invention

The present invention relates to an electronic apparatus which has an expansion support card to connect an expansion card such as a PCI type card, and more particularly, to the structure to support the expansion support card removably to a housing.

2. Description of the Related Art

Jpn. Pat. Appln. KOKAI Publications No. 2002-280778 discloses an electronic apparatus like a server which handles a large amount of data. This electronic apparatus comprises a printed circuit board mounted with a CPU and a memory, a CD-ROM drive and a hard disk drive. The components such as a printed circuit board, CD-ROM drive and hard disk drive are housed in a box-like housing. The housing comprises a base which has a bottom plate, left and right side plates, a front plate, a rear plate, and a cover which is to be fit on the base. The base supports the components. The cover hides the components by cooperating with the base.

The housing of this type of electronic apparatus contains an expansion support card. The support card is used to connect an expansion card such as a PCI type card, and electrically connected to the printed circuit board. The support card is raised along the side plate of the base, and has a connector on the upper end. The expansion card is to be inserted removably into the connector.

The support card is provided with a metal bracket. The bracket reinforces the support card to prevent deformation of the support card when the expansion card is inserted into or removed from the connector. The bracket is fixed to the side plate of the housing through a plurality of screws. By this fixation, the position of the support card is determined, and the connection of the support card to the printed circuit board is held.

In a conventional electronic apparatus, the support card to receive the expansion card is fixed by screws to the side plate of the housing by utilizing the bracket. This structure requires tightening and loosening of a plurality of screws one by one by using a tool such as a screwdriver, when fixing and removing the support card to/from the housing.

Thus, a lot of time and labor is required to mount and dismount the support card, and the time required for working is increased. At the same time, exclusive screws are necessary to fix the bracket, and the number of components is increased. As a result, the electronic apparatus manufacturing cost is increased.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

FIG. 2 is a perspective view of the server according to the first embodiment of the present invention, showing the rear view of the housing with the top cover removed from the base;

DETAILED DESCRIPTION OF THE INVENTION

A first embodiment of the present invention will be explained hereinafter with reference to FIG. 1 to FIG. 9.

Figure 1:
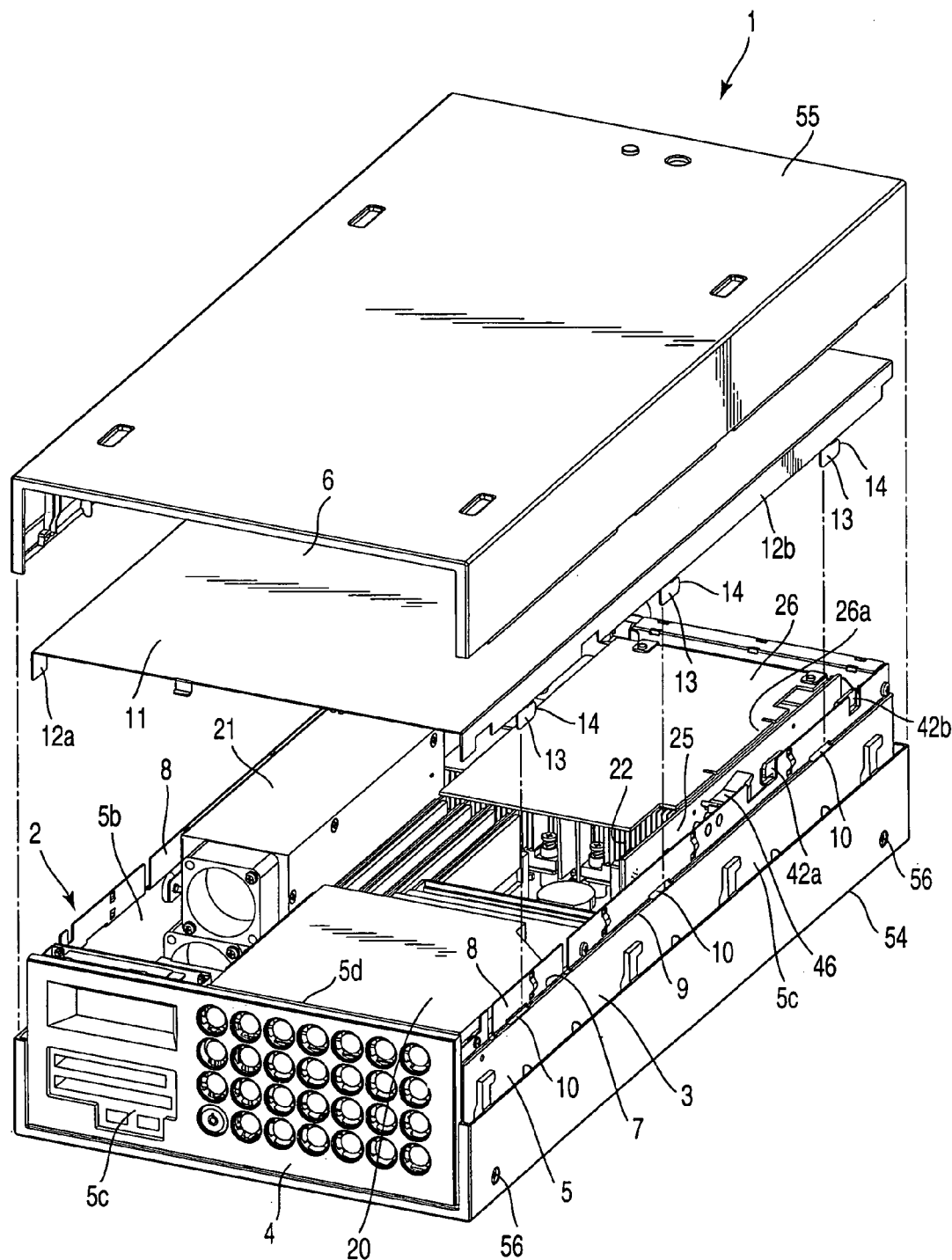
FIG. 1 is a perspective view of a server according to a first embodiment of the present invention, showing the front view of a housing with a top cover removed from a base.
Figure 3:
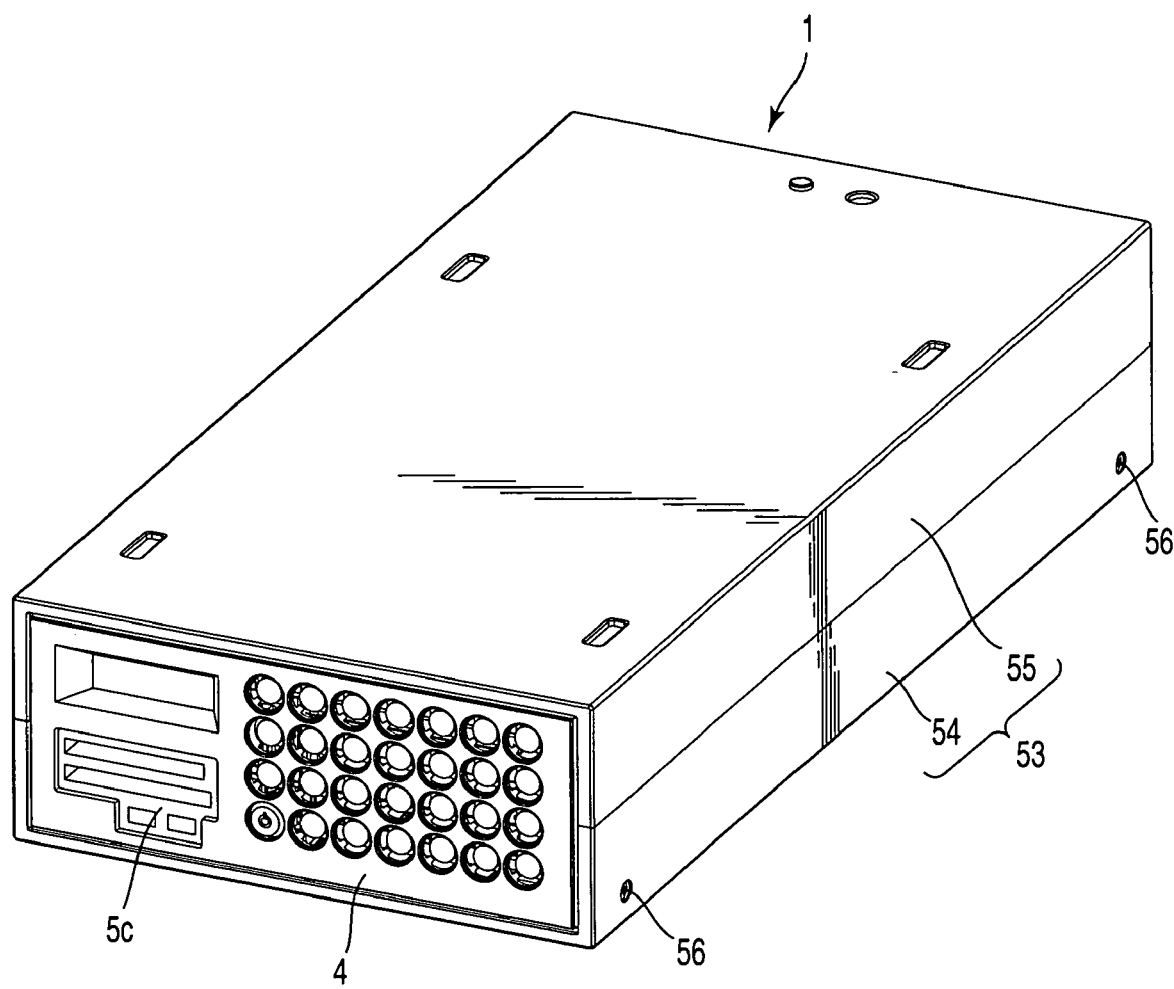
FIG. 3 is a perspective view of the server according to the first embodiment of the present invention.

FIG. 1 to FIG. 3 show a server 1 as an electronic apparatus. The server 1 has a main body 2. The main body 2 comprises a hollow box-like housing 3 and a front door 4.

The housing 3 has a base 5 and a top cover 6. The base 5 and top cover 6 are mode of metal plate. The base 5 has a rectangular bottom plate 5a, left and right side plates 5b and 5c, a front plate 5d, and a rear plate 5e. The side plates 5b and 5c, front plate 5d and rear plate 5e are raised from the edge of the bottom plate 5a. The side plates 5b and 5c correspond to the outer plate of the present invention, and are faced to each other in the width direction of the base 5.

Figure 4:
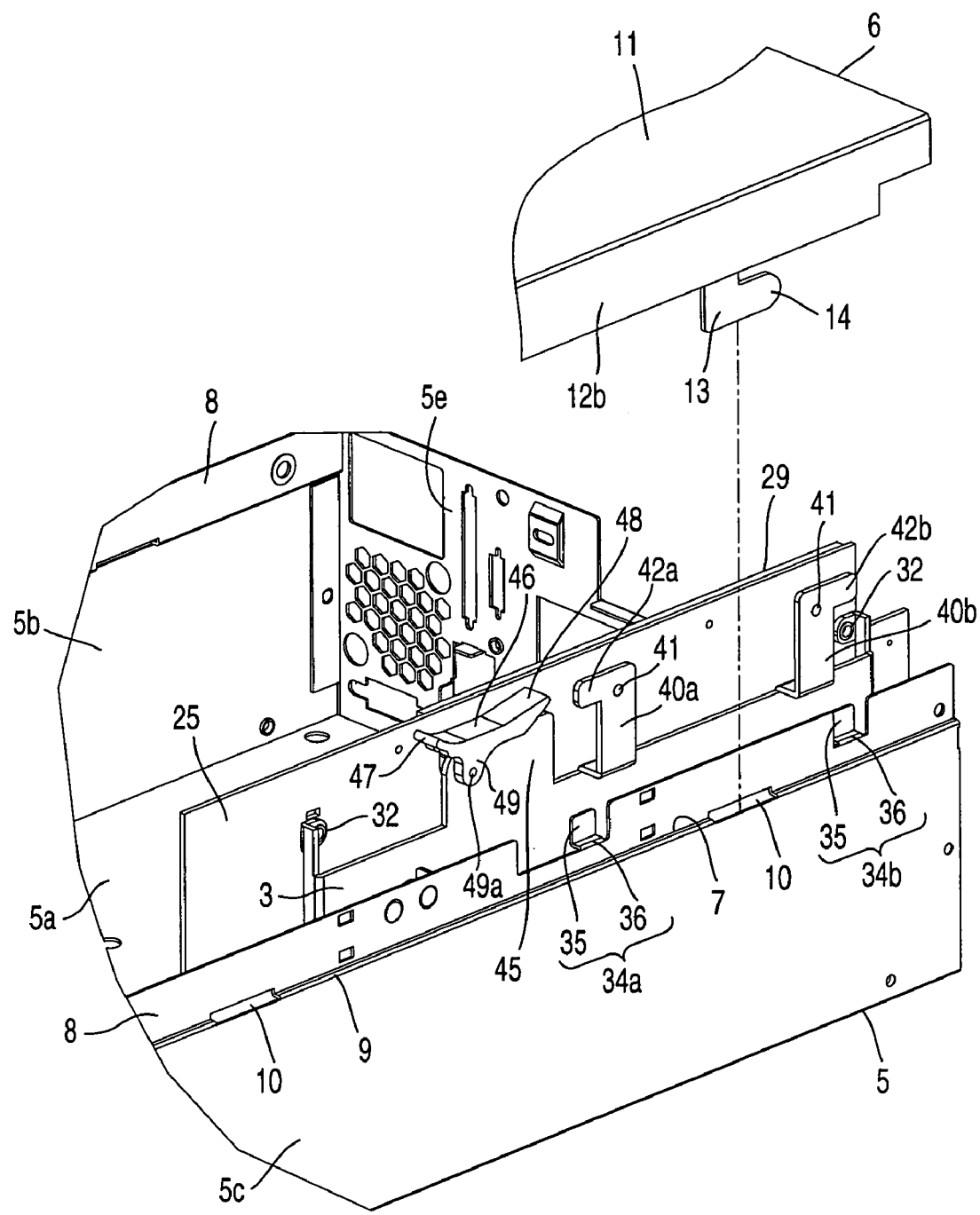
FIG. 4 is a perspective view of the server according to the first embodiment of the present invention, showing the positional relationship between a fitting piece of a bracket and a fixing part of a housing.

As shown in FIG. 4, stepped parts 7 and flanges 8 are formed at the upper end of the side plates 5b and 5c, respectively. Each stepped part 7 is bent a little like a crank toward the inside of the housing 3. Each stepped part 7 has an edge 9 and a plurality of engagement holes 10. The edge 9 extends straight toward the depth of the housing 3. The engagement holes 10 are shaped like a slit, and arranged with spaces toward the depth of the housing 3. The flanges 8 extends upward from the stepped parts 7. The flanges 8 are formed inside of the housing 3 farther than the side plates 5b and 5c by the width of the edges 9.

The top cover 6 has a rectangular ceiling board 11. The ceiling board 11 extends over the side plates 5b and 5c, front plate 5d and rear plate 5e. Flanges 12a and 12b are formed bent downward at the left and right edges of the ceiling board 11. The flanges 12a and 12b are fit over the flanges 8 of the side plates 5b and 5c. The lower edges of the flanges 12a and 12b butt against the edges 9 of the staged parts 7.

As shown in FIG. 1 and FIG. 2, a plurality of engagement pieces 13 are formed at the lower edges of the flanges 12a and 12b of the top cover 6. The engagement pieces 13 are inserted removably into the engagement holes 10 of the base 5. The engagement pieces 13 are extended downward from the lower edges of the flanges 12a and 12b, and aligned with spaces toward the depth of the ceiling board 11. Each engagement piece 13 has an extension 14 extending along the lower edges of the flanges 12a and 12b. The extension 14 projects in the direction of separating from the front plate 5d of the base 5, while the engagement piece 13 is being inserted into the engagement hole 10.

To mount the top cover 6 on the base 5, first insert the engagement pieces 13 of the top cover 6 into the engagement holes 10 of the base 5. Thus, the flanges 12a and 12b of the top cover 6 are overlaid on the flanges 8 of the base 5, and the lower edges of the flanges 12a and 12b butt against the edges 9 of the staged parts 7.

Then, slide the top cover 6 away from the front plate 5d of the base 5. By this sliding operation, the extensions 14 of the engagement pieces 13 are inserted into the lower parts of the edges 9 of the stepped parts 7 and hooked on the edges 9.

A tongue piece 15 is formed at the rear edge of the ceiling board 11, as shown in FIG. 2. The tongue piece 15 butts against the rear plate 5e of the base 5 when the top cover 6 is connected to the base 5. The tongue piece 15 is fixed to the rear plate 5e through a screw 16. By this fixation, the connection of the base 5 and top cover 6 is held, and the movement of the top cover 6 in the direction of disengaging the engagement pieces 13 from the engagement holes 10 is prevented.

Figure 7:
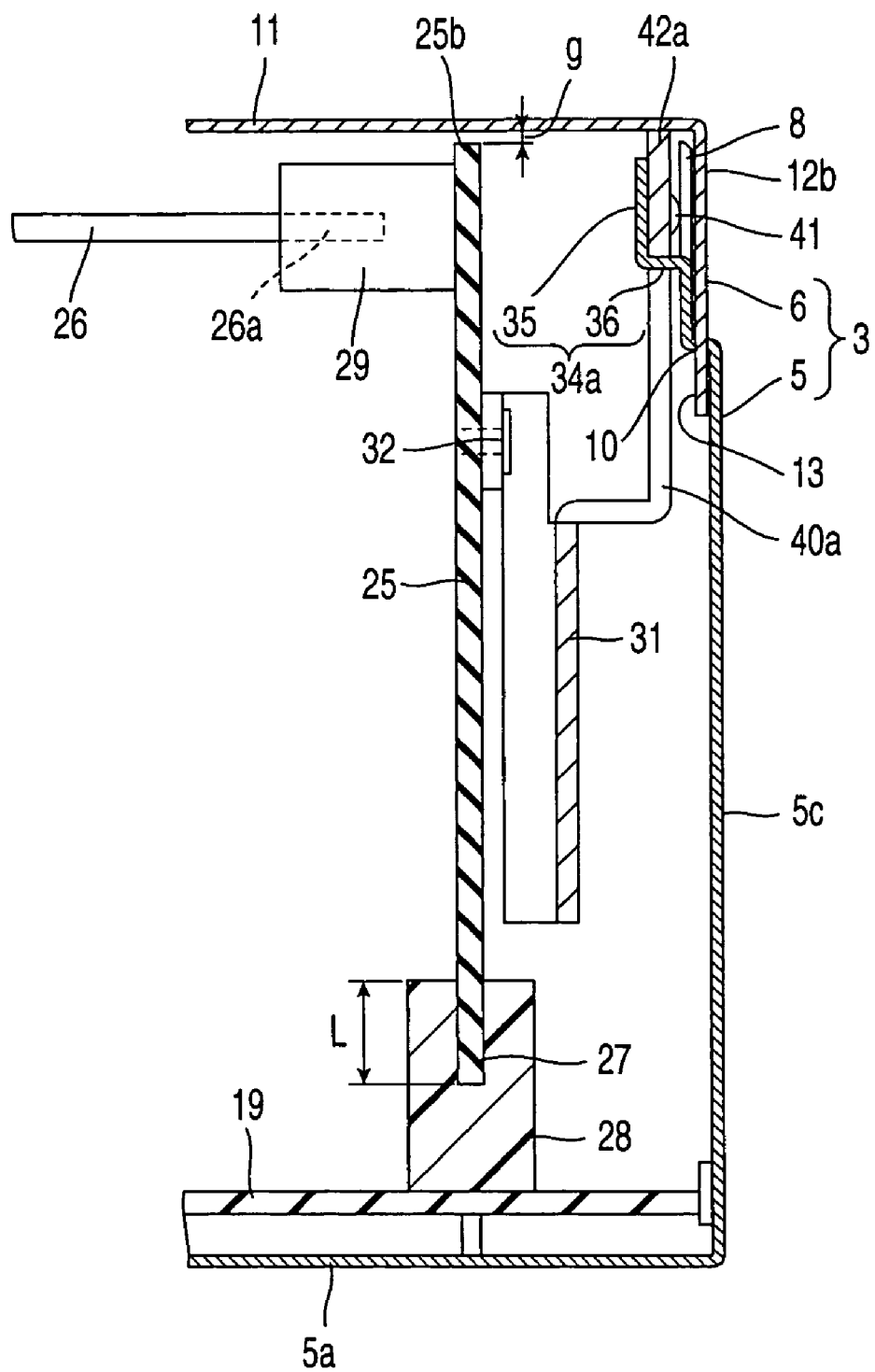
FIG. 7 is a sectional view of the server according to the first embodiment of the present invention, showing the positional relationship between the fitting piece of the bracket and the fixing part of the housing.

As shown in FIG. 1, FIG. 2 and FIG. 7, the housing 3 contains various components such as a printed circuit board 19 with a CPU mounted thereon, a CD-ROM drive 20, a power supply unit 21, a heat sink 22 to cool the CPU, and a plurality of hard disk drives (not shown). The printed circuit board 19 is fixed on the bottom plate 5a of the base 5, and located parallel to the bottom plate 5a. The CD-ROM drive 20, power supply unit 21 and hard disk drives are placed on the bottom plate 5a and printed circuit board 19, and surrounded by the side plates 5b, 5c, front plate 5d and rear plate 5e. The heat sink 22 is faced to a fan unit 23 fixed to the rear plate 5e of the base 5. The top cover 6 of the housing 3 hides the above components 19–22 by cooperating with the base 5.

The front door 4 is rectangular and sized corresponding to the front plate 5d of the base 5. The front door 4 is supported by the front end of the bottom plate 5a of the base 5 through hinges. The front door 4 is movable rotationally between the closed position to rise just like hiding the front plate 5d from the outside, and the opened position to fall down horizontally toward the front of the front plate 5d.

Figure 6:
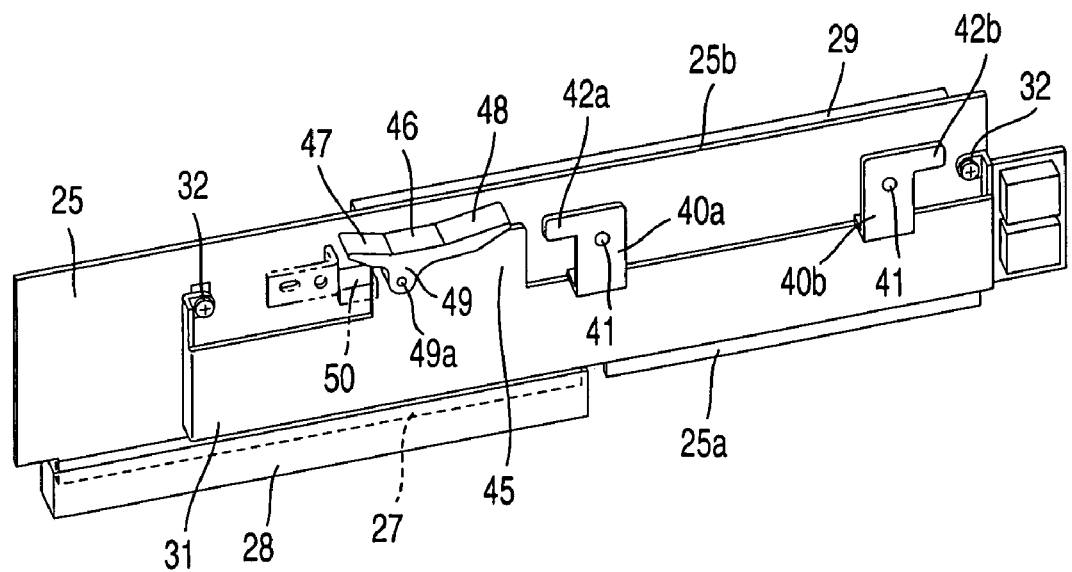
FIG. 6 is a perspective view showing of an expansion support card having the bracket in the first embodiment of the present invention.

As shown in FIG. 1, FIG. 2 and FIG. 7, the housing 3 contains an expansion support card 25 as a circuit board. The support card 25 is used to connect an expansion card 26 such as a PCI type card. As shown in FIG. 4 and FIG. 6, the support card 25 is shaped slender and rectangular extending toward the depth of the housing 3. The support card 25 rises along the right side plate 5c of the base 5 at the rear of the CD-ROM drive 20.

As shown in FIG. 6, the support card 25 has a lower edge 25a facing to the printed circuit board 19, and an upper edge 25b positioned opposite to the lower edge 25a. A terminal 27 is formed at the lower edge 25a of the support card 25. The terminal 27 is inserted into a connector 28 mounted on the upper surface of the printed circuit board 19. Thus, the printed circuit board 19 and support card 25 are held at the position orthogonal to each other.

Figure 8:
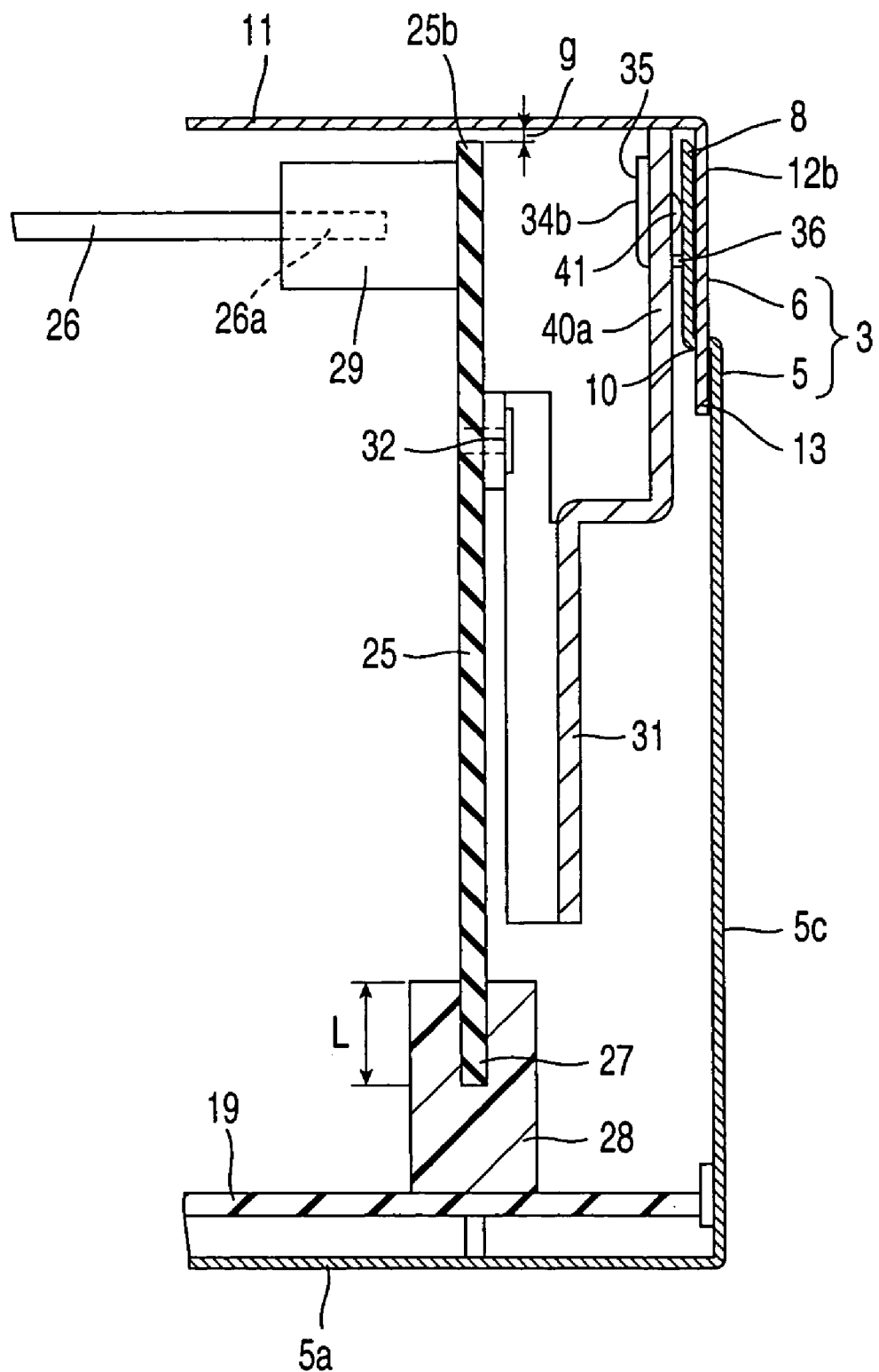
FIG. 8 is a sectional view of the server according to the first embodiment of the present invention, showing the positional relationship between a projection of the fitting piece and a holder piece of the fixing part.

As shown in FIG. 7 and FIG. 8, the upper edge 25b faces to the ceiling board 11 of the top cover 6. A gap g is formed between the ceiling board 11 and the upper edge 25b of the support card 25. The gap g is smaller than the insertion length L of the terminal 27 into the connector 28. Therefore, the ceiling board 11 restricts the movement of the support card 25 in the direction of removing the terminal 27 from the connector 28.

An expansion connector 29 is mounted at the upper end of the support card 25. The expansion connector 29 extends horizontally along the depth direction of the housing 3. A terminal 26a of the expansion card 26 is inserted removably into the expansion connector 29. The expansion card 26 is placed above the heat sink 22 and parallel to the printed circuit board 19.

As shown in FIG. 6 to FIG. 8, a metal bracket 31 is fit to the support card 25. The bracket 31 is used to reinforce the support card 25 to prevent deformation of the support card 25 when the terminal 26a of the expansion card 26 is inserted into or removed from the expansion connector 29. The bracket 31 is located opposite to the expansion connector 29 against the support card 25. The bracket 31 is shaped slender and rectangular extending along the support card 25, and is fixed to the support card 25 through a pair of screws 32. The screws 32 are separated each other in the length direction of the support card 25.

The bracket 31 is interposed between the support card 25 and the right side plate 5c of the base 5. The bracket 31 is supported removably by the side plate 5c without using a screw. The support structure of the bracket 31 will be explained by referring to FIG. 4 to FIG. 9.

Figure 5:
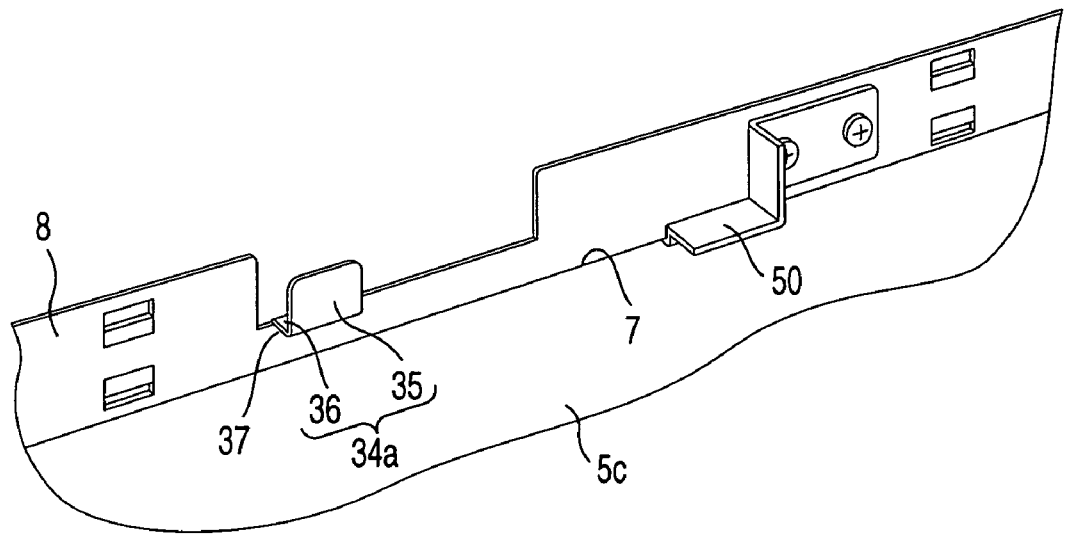
FIG. 5 is a perspective view showing the shapes of the fixing part and lever receiver of the housing in the first embodiment of the present invention.

As shown in FIG. 4, FIG. 5 and FIG. 7, the flange 8 of the side plate 5c has a pair of fixing parts 34a and 34b. The fixing parts 34a and 34b are formed as one body with the flange 8, and separated each other in the depth direction of the housing 3.

Figure 9:
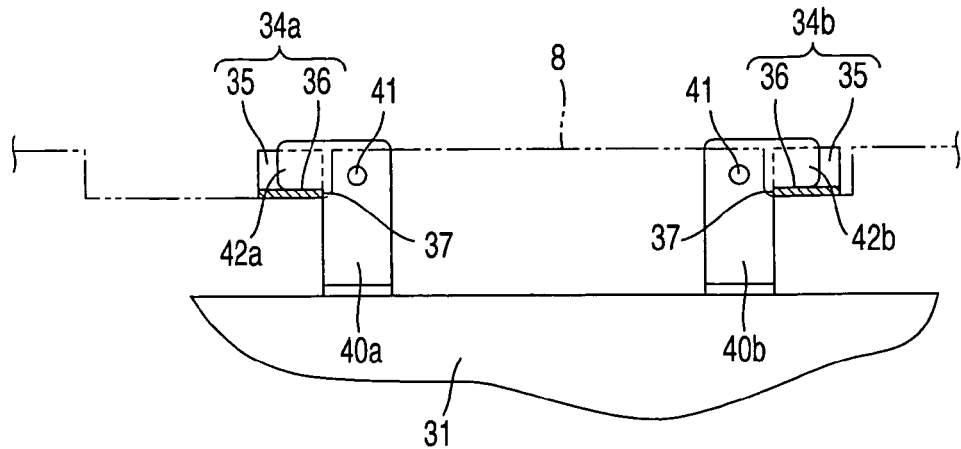
FIG. 9 is a side view showing the positional relationship between the fitting piece of the bracket and the fixing part of the housing in the first embodiment of the present invention.

In particular, each of the fixing parts 34a and 34b has a holder piece 35 and a connection piece 36. The holder piece 35 is located inside of the housing 3 farther than the flange 8 of the side plate 5c, and raised parallel to the flange 8. The connection piece 36 extends horizontally over the lower end of the holder piece 35 and the flange 8. As shown in FIG. 9, each of the connection piece 36 of one fixing part 34a and the connection piece 36 of other fixing part 34b has an edge 37 facing to each other. The edge 37 projects horizontally toward the inside of the housing 3.

As shown in FIG. 6, the bracket 31 fixed to the support card 25 has a pair of fitting pieces 40a and 40b. The fitting pieces 40a and 40b are projected upward from the upper edge of the bracket 31, and separated in the length direction of the bracket 31. When the support card 25 is connected to the connector 28, the fitting pieces 40a and 40b are interposed between the connection pieces 36 of the fixing parts 34a and 34b. In other words, each of the fitting pieces 40a and 40b contacts slidable with the edge 37 of the connection piece 36. By this contact, the position of the support card 25 in the depth direction of the housing 3 is determined.

Further, each of the fitting pieces 40a and 40b has a projection 41 and extensions 42a, 42b at the upper end. The projection 41 extends toward the flange 8, and the front end of the projection 41 contacts slidable with the inside of the flange 8. The extension 42a of one fitting piece 40a extends toward one fixing part 34a of the flange 8, and contacts slidable with the holder piece 35 of this fixing part 34a. Similarly, the extension 42b of the other engagement piece 40b extends toward the other fixing part 34b of the flange 8, and contacts slidable with the holder piece 35 of this fixing part 34b. In addition, the lower edges of the extensions 42a and 42b butt against the connection pieces 36 of the fixing parts 34a and 34b from the upper side.

Therefore, the fitting pieces 40a and 40b of the bracket 31 are held between the holder pieces 35 of the fixing parts 34a, 34b and the flange 8. This determines the position of the support card 25 against the width direction of the housing 3. Further, by the contact of the extensions 42a, 42b of the fitting pieces 40a, 40b to the connection pieces 36 of the fixing parts 34a, 34b, the insertion amount of the support card 25 into the housing 3 is determined. As a result, the support card 25 is held on the base 5 of the housing 3 by the friction force generated in the contacting part between the fitting pieces 40a, 40b and the fixing parts 34a, 34b.

As shown in FIG. 4 and FIG. 6, the bracket 31 has a lever support 45 projecting upward from the upper edge. The lever support 45 is adjacent to one fitting piece 40a, and located right above the terminal 27 of the support card 25.

An ejection lever 46 is provided at the upper end of the lever support 45. The ejection lever 46 is used to eject the support card 25 in the direction of removing the terminal 27 of the support card 25 from the connector 28. The ejection lever 46 has a first end 47, a second end 48, and a middle part 49. The first and second ends 47 and 48 are separated each other in the length direction of the bracket 31. The middle part 49 is located between the first and second ends 47 and 48, and rotatably supported by the lever support 45 through a hinge shaft 49a.

As shown in FIG. 1 and FIG. 2, when the support card 25 is contacted with the connector 28, the ejection lever 46 is interposed between the flange 8 of the side plate 5c and the upper end of the support card 25. A lever receiver 50 shown in FIG. 5 is fixed to the inside of the flange 8. The lever receiver 50 faces to the first end 47 of the ejection lever 46.

When the second end 48 of the ejection lever 46 is raised by a fingertip, the ejection lever 46 moves rotationally counterclockwise of FIG. 6. By this rotation, the first end 47 of the ejection lever 46 is pressed to the lever receiver 50. As a result, an upward force is acted by leverage on the bracket 31 and support card 25, and the terminal 27 of the support card 25 is disconnected from the connector 28.

As shown in FIG. 1 to FIG. 3, the housing 3 of the main body 2 is hidden by a face cover 53 made of synthetic resin. The face cover 53 has a first cover 54 and a second cover 55. The first cover 54 hides the lower halves of bottom plate 5a and side plates 5b and 5c of the base 5, and is fixed to the side plates 5b and 5c through a plurality of screws 56.

The second cover 55 hides the upper halves of the side plates 5b, 5c and the top cover 6, and hooks removably on the first cover 54. The second cover 55 has a tongue piece 57 at the rear edge. The tongue piece 57 is overlaid on the tongue piece 15 of the top cover 6, and is fixed to the rear plate 5e of the base 5 by utilizing the screw 16.

Explanation will now be given on the procedure of connecting the support card 26 to the connector 28 inside of the housing 3 in the server 1 configured as described above.

First, remove the screw 16, and release the fixation of the second cover 55 and top cover 6 to the base 5. Next, remove the second cover 55 from the first cover 54, and expose the top cover 6 of the housing 3. Then, move the front door 4 rotationally from the closed position to the opened position.

In this state, slide the top cover 6 toward the front door 4, and adjust the extensions 14 of the engagement pieces 13 to the engagement holes 10 of the base 5. Then, raise the top cover 6, and disengage the extensions 14 of the engagement pieces 13 from the engagement holes 10. Then, the top cover 6 can be removed from the base 5.

Next, insert the support card 25 into the base 5 with the terminal 27 faced down, and insert the terminal 27 into the connector 28. At the same time, fit the fitting pieces 40a and 40b of the bracket 31 between the fixing parts 34a and 34b. By this fitting, the fitting pieces 40a and 40b contact slidable with the edges 37 of the connection pieces 36 of the fixing parts 34a and 34b. As a result, the position of the support card 25 in the depth direction of the housing 3 is determined.

Further, the projections 41 of the fitting pieces 40a and 49b contact slidable with the inside of the flange 8, and the extensions 42a and 42b of the fitting pieces 40a and 40b contact slidable with the holder pieces 35 of the fixing parts 34a and 34b. Thus, the fitting pieces 40a and 40b are held between the holder pieces 35 of the fixing parts 34a, 34b and the flange 8. As a result, the position of the support card 25 in the width direction of the housing 3 is determined.

In addition, the lower edges of the extensions 42a and 42b of the fitting pieces 40a and 40b butt against the connection pieces 36 of the fixing parts 34a and 34b from the upper side. This determines the insertion amount of the support card 25 into the housing 3. As a result, excessive insertion of the terminal 27 into the connector 28 is restricted.

To remove the support card 25 from the housing 3, hook a fingertip on the second end 48 of the ejection lever 46, and raise the second end 48. Then, the first end 47 of the ejection lever 46 butts against the lever receiver 50 of the base 5. In other words, the ejection lever 46 moves rotationally taking the first end 47 as a point of action. By this rotation of the ejection lever 46, an upward force is acted on the bracket 31 and support card 25 based on this principle. Therefore, the terminal 27 of the support card 25 is disconnected from the connector 28, and the support card 25 can be removed from the base 5.

With this structure, the support card 25 is held in the housing 3 by fitting the bracket 31 for 1.5 reinforcement fixed to the support card 25 into the fixing parts 40a and 40b of the base 5. Therefore, the exclusive screws for fixing the support card 25 to the housing 3 become unnecessary, and the fixing and removal of the support card 25 can be performed easily without using a tool.

Further, the number of parts can be reduced by the number of screws. Therefore, it is possible to provide the server 1 at a low price by suppressing the manufacturing cost.

In addition, in the above structure, the ejection lever 46 is fixed to the bracket 31. By operating the ejection lever 46 manually, the support card 25 can be removed from the base 5 in the direction of removing the terminal 27 from the connector 28. Thus, when removing the support card 25, it is unnecessary to insert a fingertip into the narrow clearance to the side plate 5c, or to pinch the support card 25 itself with fingers. Therefore, the support card 25 can be easily removed.

Figure 10:
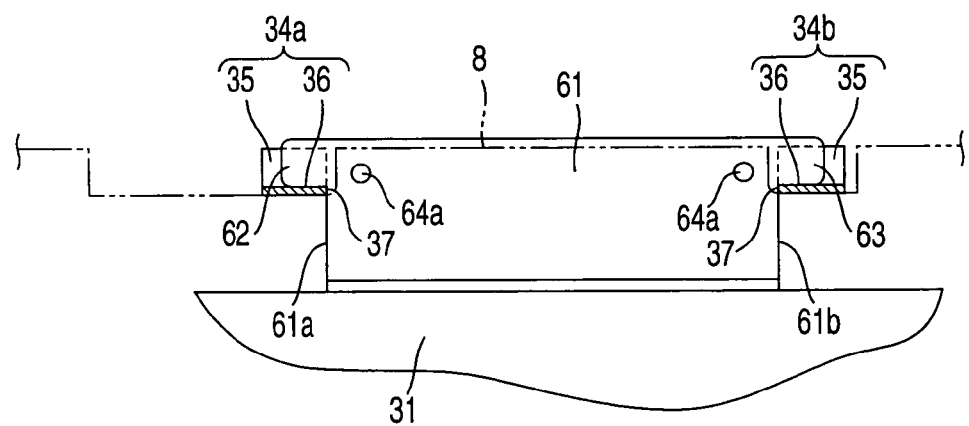
FIG. 10 is a side view showing the positional relationship between a fitting piece of a bracket and a fixing part of a housing in a second embodiment of the present invention.

The present invention is not to be limited to the first embodiment described above. FIG. 10 shows a second embodiment of the present invention. The second embodiment is different mainly in the configuration of the bracket 31 from the first embodiment. Except the bracket 31, the configuration is the same as the first embodiment. Thus, in the second embodiment, the same reference numerals are given to the same components as those of the first embodiment, and the explanation on these components will be omitted.

As shown in FIG. 10, one fitting piece 61 projecting upward is formed at the upper edge of the bracket 31. The fitting piece 61 has a first edge 61a and a second edge 61b. The first and second edges 61a and 61b extend along the support card 25 inserting direction.

The first edge 61a is adjacent to one fixing part 34a, and contacts slidable with the edge 37 of the connection piece 36, when the support card 25 is connected to the connector 28. The second edge 61b is adjacent to the other fixing part 34b, and contacts slidable with the edge 37 of the connection piece 36, when the support card 25 is connected to the connector 28.

Further, the fitting piece 61 has a first extension 62, a second extension 63, and a pair of projections 64a and 64b. The first extension 62 extends from the upper end of the first edge 61a toward one fixing part 34a, and contacts slidable with the holder piece 35 of the fixing part 34a. The second extension 63 extends from the upper end of the second edge 61b toward the other fixing part 34b, and contacts slidable with the holder piece 35 of the fixing part 34b. The lower edges of the first and second extensions 62 and 63 butt against the connection pieces 36 of the fixing parts 34a and 34b from the upper side. In addition, the projections 64a and 64b contact slidable with the inside of the flange 8 between the first extension 62 and second extension 63.

Therefore, the fitting piece 61 of the bracket 31 is held between the holder pieces 35 of the fixing parts 34a, 34b and the flange 8 of the side plate 5c. This keeps the support card 25 raised along the side plate 5c, and holds the connection of the terminal 27 to the connector 28.

Figure 11:
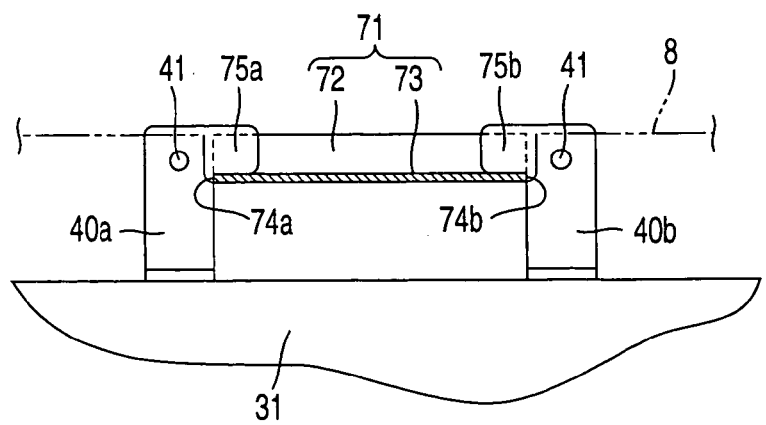
FIG. 11 is a side view showing the positional relationship between a fitting piece of a bracket and a fixing part of a housing in a third embodiment of the present invention.

FIG. 11 shows a third embodiment of the present embodiment.

In the third embodiment, the fitting structure of the bracket 31 against the flange 8 of the side plate 5c is different from the first embodiment. The other configurations of the server 1 are the same as those of the first embodiment.

As shown in FIG. 11, one fixing part 71 is formed as one body in the flange 8 of the side plate 5c. The fixing part 71 has a holder piece 72 and a connection piece 73. The holder piece 72 is raised parallel to the flange 8 at the position inside of the housing 3 farther than the flange 8. The connection piece 73 extends over the lower end of the holder piece 72 and the flange 8.

The connection piece 73 has a pair of edges 74a and 74b extending horizontally toward the inside of the housing 3. One edge 74a contacts slidable with one fitting piece 40a, when the support card 25 is connected to the connector 28. The other edge 74b contacts slidable with the other fitting piece 40b, when the support card 25 is connected to the connector 28. Thus, the fixing part 71 is held between the fitting pieces 40a and 40b.

The fitting pieces 40a and 40b have extensions 75a and 75b extending from the upper end toward the fixing part 71. The extensions 75a and 75b contact slidable with the holder piece 72 of the fixing part 71. At the same time, the lower edges of the extensions 75a and 75b butt against the connection piece 73 of the fixing part 71 from the upper side.

Therefore, the fitting pieces 40a and 40b of the bracket 31 are held between the holder piece 72 of the fixing part 71 and the flange 8 of the side plate 5c. This keeps the support card 25 raised along the side plate 5c, and holds the connection of the terminal 27 to the connector 28.

An electronic apparatus according to the present invention is not limited to a server. It can also be embodied as other information apparatus such as a desktop personal computer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
a housing having an outer plate;
a fixing part provided on the outer plate, the fixing part including a holder piece located inside of the housing farther than the outer plate and an edge projecting toward the inside of the housing;
a circuit board housed removably in the housing; and
a bracket provided on the circuit board, and interposed between the circuit board and the outer plate, the bracket having a fitting piece which is held between the outer plate and the holder piece, and butts against the edge when the circuit board is housed in the housing.

2. The electronic apparatus according to claim 1, wherein the holder piece of the fixing part is parallel to the outer plate.

3. The electronic apparatus according to claim 1, wherein the housing includes a base having the outer plate, and a cover fitting on the base and hiding the circuit board.

4. The electronic apparatus according to claim 1, wherein the fitting piece of the bracket has a projection contacting slidable with the outer plate.

5. The electronic apparatus according to claim 1, wherein the fixing part has a connection piece extending over the outer plate and the holder piece; and the fitting piece of the bracket butts against the connection piece, when the circuit board is housed in the housing.

6. The electronic apparatus according to claim 3, wherein the cover holds the fitting piece in the fixing part by contacting with the fitting piece of the bracket.

7. The electronic apparatus according to claim 3, wherein the circuit board has a terminal at one end, and an edge facing to the cover at the other end opposite to the terminal; and the housing has a connector to which the terminal of the circuit board is removably connected.

8. The electronic apparatus according to claim 7, wherein a gap between the edge of the circuit board and the cover is smaller than the insertion length of the terminal into the connector.

9. The electronic apparatus according to claim 7, wherein the bracket has an ejection lever which ejects the circuit board in the direction of removing the terminal of the circuit board from the connector, the ejection lever having a first end contacting with the outer plate, a second end operated manually, and a middle part supported rotatable by the bracket between the first and second ends; and the circuit board is ejected from the housing taking the first end of the ejection lever as a point of action, when the ejection lever is rotated in the direction of pressing the first end to the outer plate.

10. An electronic apparatus comprising:

a housing having an outer plate;

a plurality of fixing parts provided on the outer plate, each fixing part having a holder piece parallel to the outer plate at a position inside of the housing farther than the outer plate;

a circuit board located inside of the housing at a position along the outer plate, to which an expansion card is connected removably;

a bracket provided on the circuit board, and interposed between the circuit board and the outer plate, the bracket having a plurality of fitting pieces held between the outer plate and the holder piece, when the circuit board is housed in the housing; and an ejection lever for taking out the circuit board from the housing, the ejection lever having a first end contacting with the outer plate, a second end operated manually, and a middle part supported rotatable by the bracket between first and second ends; and the circuit board is ejected from the housing taking the first end of the ejection lever as a point of action, when the ejection lever is rotated in the direction of pressing the first end to the outer plate.

11. The electronic apparatus according to claim 10, wherein the housing includes a base having the outer plate, and a cover fitting on the base and hiding the circuit board and the ejection lever; and the cover holds the fitting piece in the fixing part by contacting with the fitting piece of the bracket.

12. An electronic apparatus comprising:

a housing having an outer plate;

a fixing part provided on the outer plate, the fixing part having a holder piece parallel to the outer plate at a position inside of the housing farther than the outer plate, and a connection piece extending over the outer plate and the holder piece;

a circuit board housed removably in the housing, the circuit board having a terminal and supporting removably an expansion card;

a connector provided inside of the housing, and connected removably with the terminal of the circuit board; and a bracket provided on the circuit board, and interposed between the circuit board and the outer plate, the bracket having a fitting piece which is held between the outer plate and the holder piece, and butts against the connection piece, when the circuit board is housed in the housing.

13. The electronic apparatus according to claim 12, wherein the housing includes a base having the outer plate, and a cover fitting on the base and hiding the circuit board; and the cover holds the fitting piece in the fixing part by contacting with the fitting piece of the bracket.

14. The electronic apparatus according to claim 12, wherein the bracket has an ejection lever which ejects the circuit board in the direction of removing the terminal of the circuit board from the connector, the ejection lever having a first end contacting with the outer plate, a second end operated manually, and a middle part supported rotatable by the bracket between the first and second ends; and the circuit board is ejected from the housing taking the first end of the ejection lever as a point of action, when the ejection lever is rotated in the direction of pressing the first end to the outer plate.

15. The electronic apparatus according to claim 13, wherein the circuit board has an edge facing to the cover on the opposite side of the terminal; and a gap between the edge and the cover is smaller than the insertion length of the terminal into the connector.

\* \* \* \* \*